United States Patent
Watanabe et al.

(10) Patent No.: US 9,874,596 B2
(45) Date of Patent: Jan. 23, 2018

(54) METHOD FOR MANUFACTURING SILICON CARBIDE SEMICONDUCTOR APPARATUS, AND ENERGIZATION TEST APPARATUS

(71) Applicant: MITSUBISHI ELECTRIC CORPORATION, Chiyoda-ku (JP)

(72) Inventors: Shoyu Watanabe, Tokyo (JP); Akihiro Koyama, Tokyo (JP); Shigehisa Yamamoto, Tokyo (JP); Yukiyasu Nakao, Tokyo (JP); Kazuya Konishi, Tokyo (JP)

(73) Assignee: MITSUBISHI ELECTRIC CORPORATION, Chiyoda-ku (JP)

(*) Notice: Subject to any disclaimer, the term of this patent is extended or adjusted under 35 U.S.C. 154(b) by 216 days.

(21) Appl. No.: 14/772,304

(22) PCT Filed: Mar. 10, 2014

(86) PCT No.: PCT/JP2014/056165
§ 371 (c)(1),
(2) Date: Sep. 2, 2015

(87) PCT Pub. No.: WO2014/148294
PCT Pub. Date: Sep. 25, 2014

(65) Prior Publication Data
US 2016/0003889 A1  Jan. 7, 2016

(30) Foreign Application Priority Data

Mar. 19, 2013 (JP) .................................. 2013-055838

(51) Int. Cl.
*G01R 31/26* (2014.01)
*H01L 21/66* (2006.01)
(Continued)

(52) U.S. Cl.
CPC ...... *G01R 31/2632* (2013.01); *G01R 31/2648* (2013.01); *G01R 31/2855* (2013.01);
(Continued)

(58) Field of Classification Search
CPC combination set(s) only.
See application file for complete search history.

(56) References Cited

U.S. PATENT DOCUMENTS 7,545,040 B2   6/2009   Ueki et al.
7,768,017 B2   8/2010   Nakayama et al.
(Continued)

FOREIGN PATENT DOCUMENTS

JP   06-194405 A    7/1994
JP   10-308512 A   11/1998
(Continued)

OTHER PUBLICATIONS

Rajesh Kumar Malhan, "Impact of SiC Crystal Defects on the Degradation Phenomenon of PN Diodes", The Proceedings of the 11th Meeting on SiC and Related Widegap Semiconductors, Nov. 20-22, 2002, pp. 13.
(Continued)

*Primary Examiner* — Telly Green
(74) *Attorney, Agent, or Firm* — Oblon, McClelland, Maier & Neustadt, L.L.P.

(57) ABSTRACT

The present invention provides a method for manufacturing silicon carbide semiconductor apparatus including a testing step of testing a PN diode for the presence or absence of stacking faults in a relatively short time and an energization test apparatus. The present invention sets the temperature of a bipolar semiconductor element at 150° C. or higher and 230° C. or lower, causes a forward current having a current density of 120 [A/cm$^2$] or more and 400 [A/cm$^2$] or less to continuously flow through the bipolar semiconductor ele-
(Continued)

ment, calculates, in a case where a forward resistance of the bipolar semiconductor element through which the forward current flows reaches a saturation state, the degree of change in the forward resistance, and determines whether the calculated degree of change is smaller than a threshold value.

12 Claims, 13 Drawing Sheets

(51) Int. Cl.
  *H01L 29/16* (2006.01)
  *H01L 29/32* (2006.01)
  *H01L 29/66* (2006.01)
  *H01L 29/78* (2006.01)
  *G01R 31/28* (2006.01)
  *H01L 21/56* (2006.01)

(52) U.S. Cl.
  CPC ........ *G01R 31/2877* (2013.01); *H01L 21/565* (2013.01); *H01L 22/14* (2013.01); *H01L 29/1608* (2013.01); *H01L 29/32* (2013.01); *H01L 29/66068* (2013.01); *H01L 29/7805* (2013.01); *H01L 2924/0002* (2013.01)

(56) References Cited

U.S. PATENT DOCUMENTS

| | | |
|---|---|---|
| 7,960,257 B2 | 6/2011 | Nakayama et al. |
| 7,960,737 B2 | 6/2011 | Nakayama et al. |
| 7,960,738 B2 | 6/2011 | Nakayama et al. |
| 2006/0113685 A1* | 6/2006 | Ueki .................. H01L 23/53233 257/785 |
| 2009/0203208 A1 | 8/2009 | Ueki et al. |
| 2012/0061844 A1 | 3/2012 | Ueki et al. |

FOREIGN PATENT DOCUMENTS

| | | |
|---|---|---|
| JP | 2002-110751 A | 4/2002 |
| JP | 2005-167035 A | 6/2005 |
| JP | 2011-109018 A | 6/2011 |
| JP | 2012-28565 A | 2/2012 |
| JP | 2012-216675 A | 11/2012 |
| WO | 2004/053971 A1 | 6/2004 |

OTHER PUBLICATIONS

International Search Report dated Jun. 10, 2014 for PCT/JP2014/056165 filed on Mar. 10, 2014.

International Preliminary Report on Patentability and Written Opinion dated Oct. 1, 2015 in PCT/JP2014/056165 (with English language translation).

Japanese Office Action dated Jul. 5, 2016 in Patent Application No. 2015-506707 (with Partial English Translation).

* cited by examiner

F I G . 1
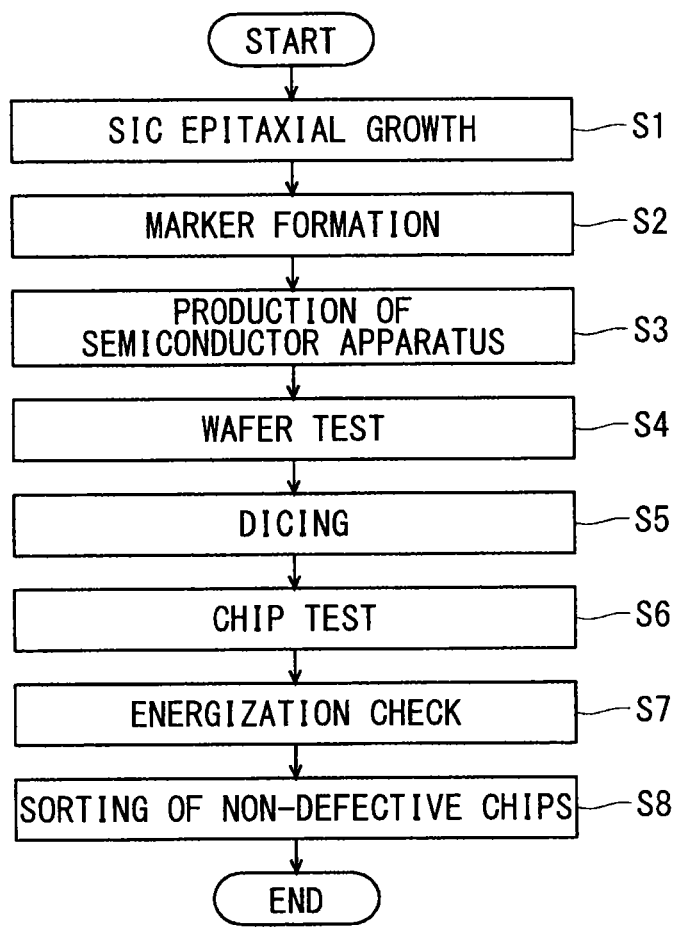

F I G . 2
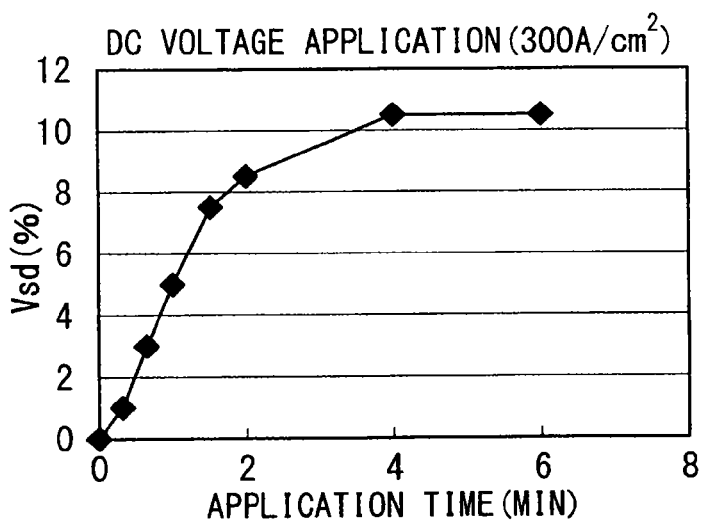
F I G . 3
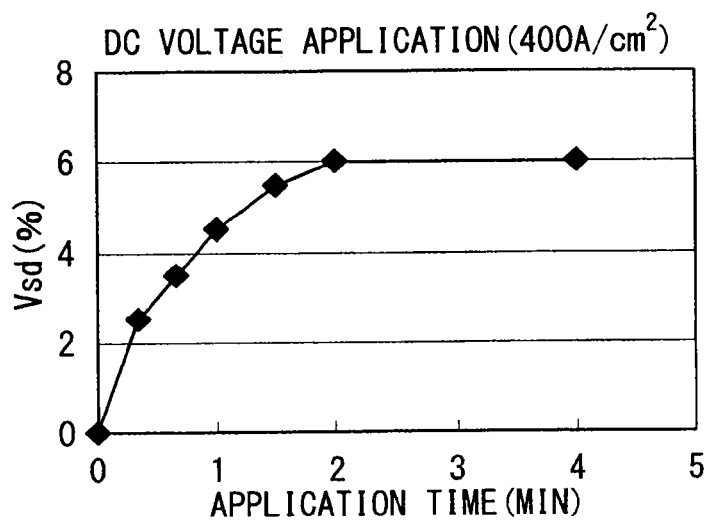

F I G . 6
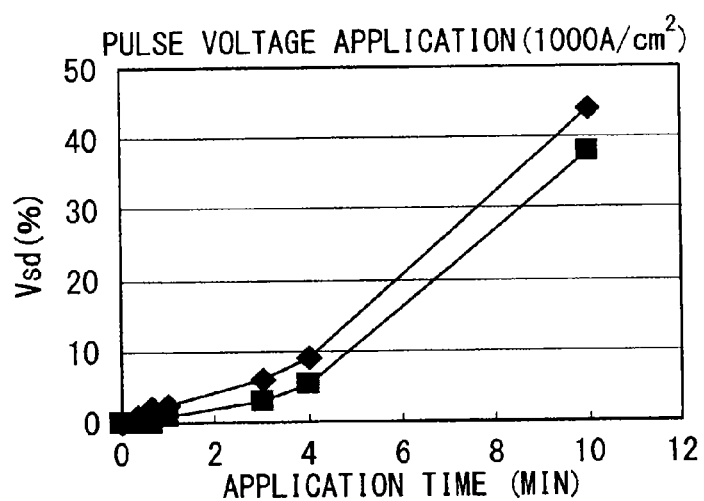

F I G . 7

| CURRENT DENSITY | 200A/cm² | 300A/cm² | 400A/cm² | 500A/cm² | 600A/cm² | 1000A/cm² |
|---|---|---|---|---|---|---|
| PRESENCE OR ABSENCE OF SATURATION | SATURATED | SATURATED | SATURATED | UNSATURATED | UNSATURATED | UNSATURATED |

F I G. 8
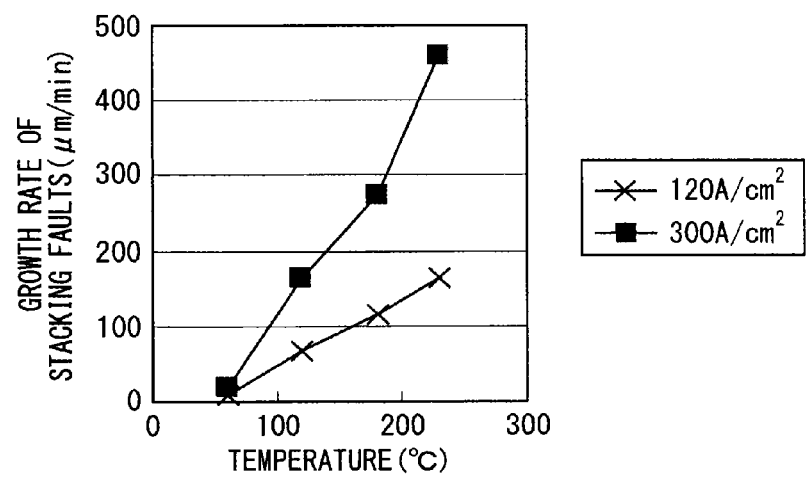
F I G. 9
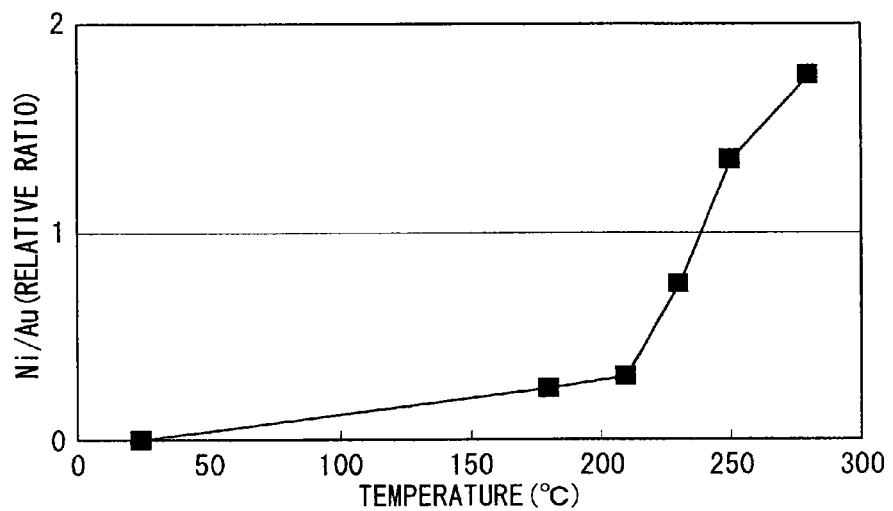

F I G . 1 2
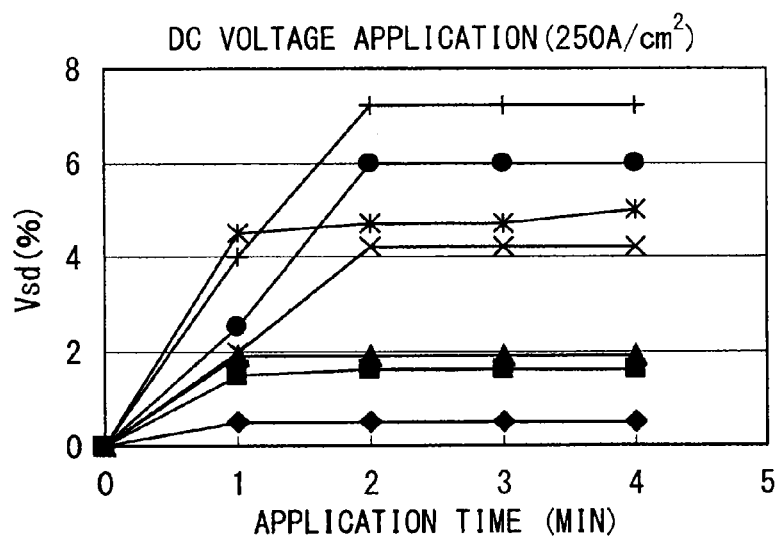
F I G . 1 3
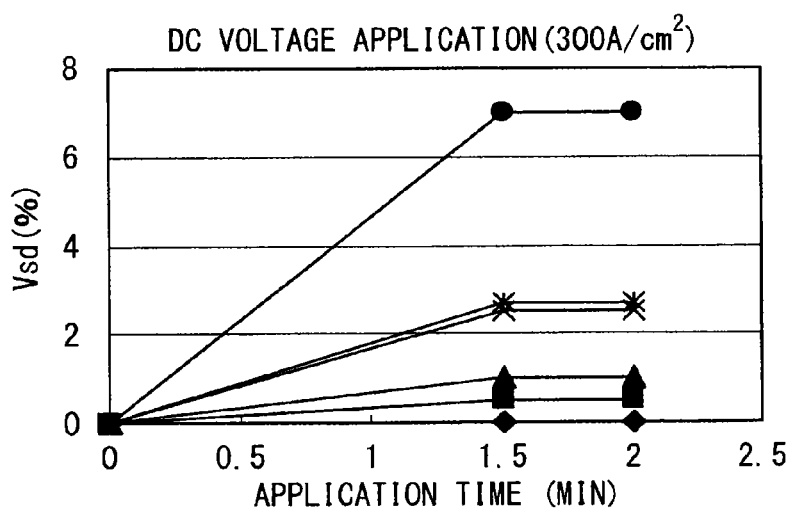

| CHIP PRODUCTION CONDITIONS | YIELD (%) AT Vsd OF LESS THAN 1% | EFFICIENCY PERCENTAGE (%) AFTER ENERGIZATION |
|---|---|---|
| PRODUCTION CONDITION A | 100 | 100 |
| PRODUCTION CONDITION B | 75 | 100 |
| PRODUCTION CONDITION C | 40 | 100 |
| PRODUCTION CONDITION D | 40 | 100 |

METHOD FOR MANUFACTURING SILICON CARBIDE SEMICONDUCTOR APPARATUS, AND ENERGIZATION TEST APPARATUS

TECHNICAL FIELD

The present invention relates to a method for manufacturing silicon carbide semiconductor apparatus including a step of testing semiconductors and to an energization test apparatus.

BACKGROUND ART

In a semiconductor apparatus including a semiconductor made of, for example, silicon carbide, a forward current caused to flow through a PN diode prompts nucleation associated with recombination of electrons and positive holes, resulting in the growth of stacking faults expanding from basal plane dislocations in a semiconductor substrate. Unfortunately, this causes the relevant region to be highly resistive.

As a method of testing for the presence or absence of the stacking faults generated as described above, the occurrence of forward voltage degradation (voltage increase) is detected after one-hour energization at a current density of 100 [$A/cm^2$] in a forward direction of the PN diode (see Patent Document 1).

It has been shown that the forward voltage degradation would occur if a product provided with measures against forward voltage degradation is energized at a current density of 200 [$A/cm^2$] or more or if the product is energized at a current density of 100 [$A/cm^2$] at a high temperature over 200° C. (see Patent Document 2).

As another example, it has been reported that the forward voltage degradation occurred due to 4.5 hour energization at a current density of 600 [$A/cm^2$] and thus no light emission associated with electroluminescence (EL) was observed in some places due to defects (see Non-Patent Document 1).

PRIOR ART DOCUMENTS

Patent Documents

Patent Document 1: Japanese Patent Application Laid-Open No. 2005-167035
Patent Document 2: Japanese Patent Application Laid-Open No. 2011-109018

Non-Patent Document

Non-Patent Document 1: "Impact of SiC crystal defects on the degradation phenomenon of pn diodes," The Proceedings of the 11th Meeting on SiC and Related Widegap Semiconductors, Nov. 20-22, 2002, p13.

SUMMARY OF INVENTION

Problems to be Solved by the Invention

A single crystal of four-cycle hexagonal silicon carbide (4H-SiC) is widely known as one of the semiconductor materials. For the n-type conductivity, the minority carriers are positive holes.

It is known that stacking faults are generated in the drift layer by the energy associated with the recombination of positive holes being the minority carriers with electrons in basal plane dislocations in crystals when the bipolar operation through the use of 4H-SiC causes a current to flow in the forward direction of a PN diode (including the body diode for a metal-oxide-semiconductor field-effect transistor (MOSFET)).

The stacking faults formed in the drift layer become the highly resistive regions, which increase the forward voltage. Thus, the reliability of semiconductor apparatuses has been reduced due to the formation of stacking faults, resulting in increased power loss.

The degree of growth of stacking faults expanding from the basal plane dislocations is affected by how the energy is generated during recombination of the above-mentioned positive holes being the minority carriers with electrons. If no positive holes recombine with electrons in the absence of basal plane dislocations, energy associated with the recombination would not be generated in the first place and thus no stacking faults would grow.

In view of such circumstances, it is necessary to provide the step of testing for the presence or absence of stacking faults affecting the reliability of semiconductor apparatus.

Another method employed in the test for the presence or absence of stacking faults causes a current to flow (at a current density of 600 [$A/cm^2$] for about four to five hours) in the forward direction of the PN diode (including the body diode for the MOSFET), and then, performs the test for the presence or absence of stacking faults with photoluminescence (PL) (see Non-Patent Document 1). According to this method, the light-emitting part corresponds to the part in which stacking faults are generated. Thus, the presence or absence of light emission can be used as a test for the presence or absence of stacking faults.

According to the conventional technique, the current density of the forward current has been set within the current setting range, which has been known as 100 [$A/cm^2$] at room temperature. This technique has required the energization time of one hour or more to determine the degradation of (an increase in) forward voltage (see Patent Document 1).

It has been shown that the forward voltage degradation would occur due to energization at a current density of 200 [$A/cm^2$] or more or energization at a current density of 100 [$A/cm^2$] at a high temperature over 200° C. (see Patent Document 2).

In order to determine the presence or absence of stacking faults, it is necessary to cause a current having a current density of 100 [$A/cm^2$] or more to flow, making it difficult to provide the chip-state evaluations with the conventional technique. Thus, modularization has been necessary to determine the presence or absence of stacking faults.

Thus, in order to test each chip for the presence or absence of stacking faults, it has been necessary to cause a forward current to flow through the chip for a long period of time (for example, one hour or more), resulting in long hours of testing. This has caused an increase in manufacturing cost.

The present invention therefore has been made to solve the problems described above, and objects thereof are to provide a method for manufacturing silicon carbide semiconductor apparatus including a testing step of testing a PN diode for a semiconductor chip for the presence or absence of stacking faults in a relatively short time and to provide an energization test apparatus.

Means to Solve the Problems

A method for manufacturing silicon carbide semiconductor apparatus according to one aspect of the present invention includes a setting step of setting a temperature of a bipolar semiconductor element made of silicon carbide at 150° C. or higher and 230° C. or lower, an energizing step of causing a forward current having a current density of 120 [A/cm$^2$] or more and 400 [A/cm$^2$] or less to continuously flow through the bipolar semiconductor element, a calculating step of calculating, in a case where a forward resistance of the bipolar semiconductor element through which the forward current flows reaches a saturation state, a degree of change in the forward resistance, and a determining step of determining whether the calculated degree of change is smaller than a threshold value.

An energization test apparatus according to one aspect of the present invention is an energization test apparatus that causes the forward current to flow between the front surface electrode and the back surface electrode located on the front surface and the back surface of the bipolar semiconductor element in the method for manufacturing silicon carbide semiconductor apparatus mentioned above. The energization test apparatus includes a cooling plate that is located so as to come in contact with the back surface electrode of the bipolar semiconductor element and cools the bipolar semiconductor element and a pressure plate that is located so as to come in contact with the front surface electrode of the bipolar semiconductor element and applies a pressure onto the bipolar semiconductor element.

Effects of the Invention

According to the above-mentioned aspect of the present invention, the bipolar semiconductor element can be tested for the presence or absence of stacking faults in a short time on the basis of the degree of change in the forward resistance that has reached the saturation state due to the continuous flow of the forward current having a current density of 120 [A/cm$^2$] or more and 400 [A/cm$^2$] or less.

These and other objects, features, aspects and advantages of the present invention will become more apparent from the following detailed description of the present invention when taken in conjunction with the accompanying drawings.

BRIEF DESCRIPTION OF DRAWINGS

FIG. 1 is a flowchart illustrating the outline of a method for manufacturing silicon carbide semiconductor apparatus according an embodiment.

FIG. 2 illustrates the percentage change in forward voltage at a current density of 300 [A/cm$^2$].

FIG. 3 illustrates the percentage change in forward voltage at a current density of 400 [A/cm$^2$].

FIG. 6 illustrates the percentage change in forward voltage at a current density of 1000 [A/cm$^2$].

FIG. 7 illustrates the relation between the current density of forward current and the presence or absence of a saturation state.

FIG. 8 illustrates the temperature dependence of the growth rate of stacking defects.

FIG. 9 illustrates the Ni/Au ratio associated with temperature changes.

FIG. 12 illustrates the percentage change in forward voltage at a current density of 250 [A/cm$^2$].

FIG. 13 illustrates the percentage change in forward voltage at a current density of 300 [A/cm$^2$].

DESCRIPTION OF EMBODIMENT

Figure 4:
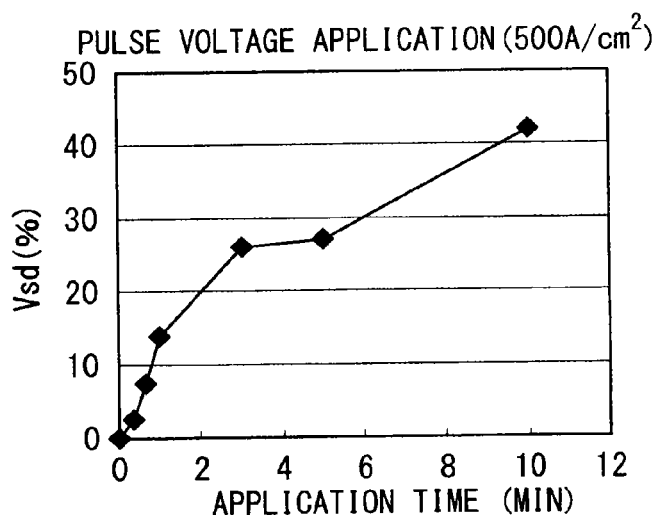
FIG. 4 illustrates the percentage change in forward voltage at a current density of 500 [A/cm$^2$].

The following describes an embodiment with reference to the accompanying drawings.

<Embodiment>
<Testing Step>

The following method is applicable to the production of SiC-MOSFETs as well as the production of SiC-PN diodes as a method for manufacturing silicon carbide semiconductor apparatuses including a testing step of testing a built-in body diode. In the description below, a body diode (a bipolar semiconductor element) for the SiC-MOSFET is taken as an example.

First, with reference to FIG. 1, the following describes the outline from the production of semiconductor device through an energization check to a sorting step.

A SiC epitaxial layer is firstly grown on a SiC substrate (Step S1).

Then, markers serving as the positional reference are formed in the SiC epitaxial layer and various layers formed thereon (Step S2).

Then, a semiconductor apparatus is produced by forming, for example, electrodes (Step S3).

Then, a wafer test including an electrical characteristic test is performed (Step S4).

Then, the wafer is diced to form semiconductor chips (Step S5).

Then, the semiconductor chips are subjected to a chip test including an electrical characteristic test (Step S6).

Then, the semiconductor chips are subjected to an energization check (Step S7).

Then, the semiconductor chips determined to be non-defective items in the energization check are sorted out (Step S8). The product including only the chips sorted out as non-defective items is shipped.

Although not illustrated in FIG. 1, the semiconductor chips to be shipped undergo a molding step of providing resin sealing and then proceeds to the module assembly. The semiconductor apparatus described in this embodiment includes, beside the above-mentioned semiconductor chips, the semiconductor chips that have undergone the molding step.

The present invention is particularly intended to provide a manufacturing method including a step of providing the test for the presence or absence of stacking faults in a short time during the determination of non-defective items in the above-mentioned chip test.

<Current Density Dependence 1>

In the body diode, the direction of current flow from the source to the drain is defined as the forward direction. At room temperature, the current density of the DC forward current is set at 300 [$A/cm^2$] and 400 [$A/cm^2$], and then, a percentage change Vsd of the forward voltage from the initial value is measured. Then, the percentage change Vsd is obtained by measurement at each current application time. The results are shown in FIG. 2 (obtained at a current density of 300 [$A/cm^2$]) and FIG. 3 (obtained at a current density of 400 [$A/cm^2$]). In each of the drawings, the vertical axis indicates the percentage change Vsd [%] of the forward voltage from the initial value and the horizontal axis indicates the application time [min].

The above-mentioned drawings show the percentage change Vsd [%] of the forward voltage from the initial value based on the assumption that the initial value of the percentage change Vsd is 0%. With reference to FIG. 2 (obtained at a current density of 300 [$A/cm^2$]), the percentage change Vsd is saturated in about 4 minutes. With reference to FIG. 3 (obtained at a current density of 400 [$A/cm^2$]), the percentage change Vsd is saturated in about 2 minutes.

It is considered that the growth rate of stacking faults extending from the basal plane dislocations increases with increasing current density and thus the stacking faults are saturated in a shorter time.

When a forward current flows having a DC current density of 300 [$A/cm^2$] is caused to flow (FIG. 2) and a forward current having a DC current density of 400 [$A/cm^2$] is caused to flow (FIG. 3), the percentage change Vsd increases along with the growth of stacking faults extending from the basal plane dislocations, and then, the percentage change Vsd appears to gradually approach saturation. The percentage change Vsd that has reached the saturation state is measured, which allows for the quantitative assessment of stacking fault density (area).

The saturation sate of the percentage change Vsd indicates that the growth of stacking faults has reached saturation (stopped). It is considered that stacking faults grow from some basal plane dislocations and no stacking faults grow from other basal plane dislocations due to less energy associated with recombination of positive holes being the minority carries with electrons, resulting in the saturation phenomenon of the stacking fault generation. The percentage changes Vsd in the saturation state are compared among semiconductor devices, whereby the semiconductor devices can be accurately tested for defects associated with the stacking fault density. If the semiconductor device has a smaller stacking fault density and only a slight increase in the percentage change Vsd, it is determined that the semiconductor device is the non-defective item whose characteristics are not degraded in the reliability assessment check.

<Current Density Dependence 2>

Figure 5:
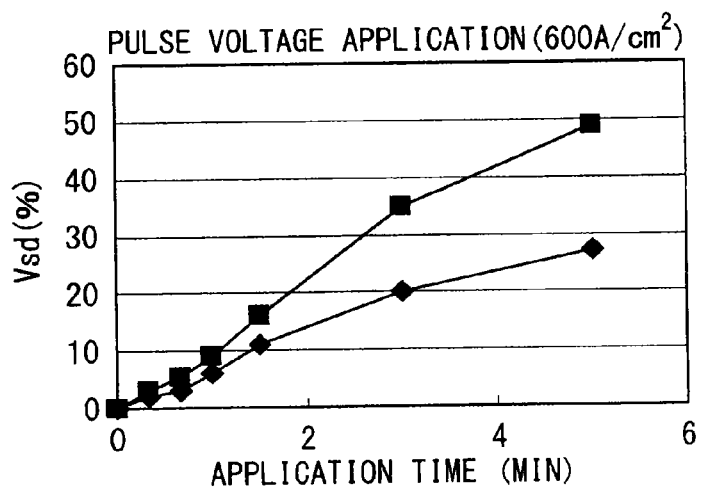
FIG. 5 illustrates the percentage change in forward voltage at a current density of 600 [A/cm$^2$].

Next, FIGS. 4, 5, and 6 indicate the percentage change Vsd at an increased current density being 500 [$A/cm^2$] (FIG. 4), 600 [$A/cm^2$] (FIG. 5), and 1000 [$A/cm^2$] (FIG. 6). In each of the drawings, the vertical axis indicates the percentage change Vsd [%] of the forward voltage from the initial value and the horizontal axis indicates the application time [min]. FIGS. 5 and 6 each show a superimposed view of results of the tests performed on a plurality of semiconductor devices.

In each of the cases shown in the drawings, the temperature of the semiconductor devices is set at room temperature. The forward current is applied in pulses, with a pulse duration of 1 [ms] and a duty of 80% for the case in FIG. 4, with a pulse duration of 1 [ms] and a duty of 25% for the case in FIG. 5, and with a pulse duration of 1 [ms] and a duty of 10% for the case in FIG. 6.

With reference to FIGS. 4, 5, and 6, the percentage change Vsd increases with increasing application time, showing no saturation characteristic. Thus, in the time range (up to about 12 minutes) shown in FIGS. 4, 5, and 6, no saturation state is discernible along with the lapse of time. The percentage change Vsd is as high as 30 to 40%, implying the growth of stacking defects and the resulting increase in stacking fault density.

The percentage change Vsd that has not reached the saturation state indicates that the stacking faults continues to grow and thus the stacking fault density has not reached saturation. It is considered that energy associated with the recombination of the minority carriers with electrons increases due to a high current density of the forward current, and as a result, the stacking faults extending from the basal plane dislocations continue to grow, so that the growth of stacking faults does not easily reach saturation.

When the current density is low, stacking faults grow from some basal plane dislocations and no stacking faults grow from other basal plane dislocations. When the current density is high, meanwhile, the growth of stacking faults is absent only in few basal plane dislocations, and thus it is considered that the occurrence of stacking faults does not easily reach saturation. The percentage change Vsd has a greater value, indicating the increased degradation of semiconductor devices associated with stacking faults. The continuous growth of stacking faults causes characteristic degradation in the reliability assessment.

The percentage change Vsd shows one of two separate trends depending on the current density of the forward current. It is shown that the saturation characteristic of the percentage change Vsd appears if the current density is higher than 0 [$A/cm^2$] and lower than or equal to 400 [$A/cm^2$] and the saturation characteristic of the percentage change Vsd does not appear if the current density is higher than or equal to 500 [$A/cm^2$]. If the saturation characteristic does not appear, the stacking faults continue to grow, which continuously increases the stacking fault density.

The stacking faults grow at different rates in different semiconductor devices. In a case where the saturation characteristic of the percentage change Vsd does not appear, the forward voltage increases with increasing voltage application time, resulting in a higher stacking fault density and thus causing failure of the semiconductor device. This is unfavorable in terms of the chip assessment.

In a case where the saturation characteristic of the percentage change Vsd appears, meanwhile, the stacking fault density is unaffected by the above-mentioned individual differences in growth rate. Thus, the stacking fault density can be accurately determined when the saturation characteristic appears. It takes few minutes before the above-mentioned appearance of the saturation characteristic, and thus, such determination can be performed in a short time.

FIG. 7 summarizes the relation between the current density [$A/cm^2$] of the forward current and the presence or absence of the saturation state. As shown in FIG. 7, the saturation characteristic appeared at a current density of 200 [$A/cm^2$] as well as in the above-mentioned examples.

<Temperature Dependence>

The following describes the dependence of the semiconductor device on the setting temperature while a forward current is caused to flow. FIG. 8 shows the temperature dependence of the growth rate of stacking faults. With reference to FIG. 8, the vertical axis indicates the growth rate [µm/min] of stacking faults and the horizontal axis indicates the temperature [° C.].

FIG. 8 shows the temperature range from 60° C. to 230° C. and the graphs indicates the results obtained at a current density of 120 [A/cm²] and at a current density of 300 [A/cm²].

As shown in FIG. 8, the growth rate of stacking faults increases with increasing temperature at both current densities. As the growth rate of stacking faults increases, the stacking faults reach saturation in a shorter time, which is advantageous.

The following refers to the solder wettability between the semiconductor device and the substrate.

FIG. 9 illustrates the Ni/Au ratio obtained by Auger electron spectroscopy (AES) in a case where the semiconductor device is kept at a high temperature and then the temperature is changed. This is provided for the assessment of the solder wettability associated with changes in the temperature of the semiconductor device. The Ni/Au ratio indicated by the vertical axis is the value relative to the acceptance criterion value. The horizontal axis indicates the temperature [° C.].

As evident from the drawing, the Ni/Au ratio sharply increases at around 230° C., exceeding the acceptance criterion value. Thus, in the above-mention test that causes a forward current to flow, the highest setting temperature of the semiconductor device is desirably limited to 230° C. in order to prevent the deterioration of the solder wettability between the semiconductor device and the substrate. That is, in view of the solder wettability, the maximum value of the semiconductor device is set at 230° C.

Figure 10:
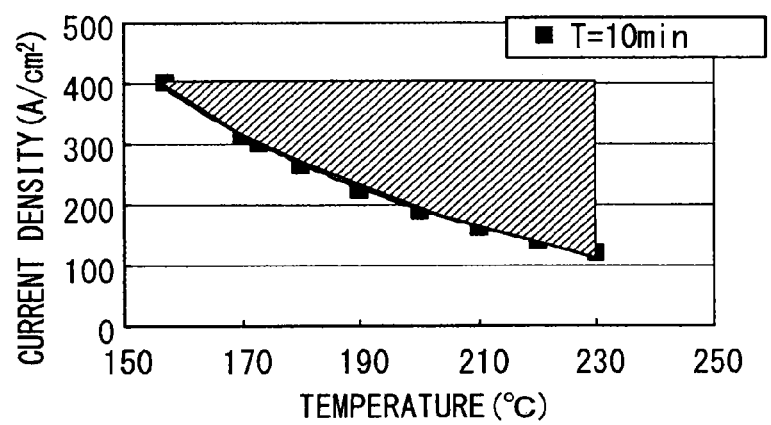
FIG. 10 illustrates temperatures and a current range for achieving a testing time of 10 minutes or less, the testing time being calculated from the growth rate of stacking faults.

FIG. 10 illustrates the temperatures and a current range for achieving a testing time of 10 minutes or less. The testing time is calculated from the growth rate of stacking faults. With reference to FIG. 10, the vertical axis indicates the current density [A/cm²] and the horizontal axis indicates the temperature [° C.]. The growth rate of stacking faults is obtained from the experiment, and thus, the following expression provides a time t during which stacking faults expands across the entire surface of the semiconductor device.

$$t = \text{EXP}\left(0.31\left(\frac{1}{273+T} - \frac{1}{503}\right)\frac{1}{8.62 \times 10^{-5}}\right) \times \frac{1200}{J} \quad [\text{Math 1}]$$

In the expression (1), J represents the current density [A/cm²] of a forward current caused to flow through the semiconductor device and T represents the temperature [° C.] set for the semiconductor device.

This relational expression yields the range of a temperature T and a current density J for achieving the time t of 10 minutes or less, corresponding to the diagonally shaded range in FIG. 10. The diagonally shaded range is confined within the temperature limit of 230° C. or lower and the current density limit of 400 [A/cm²] or less as mentioned above.

As shown in FIG. 10, the range above the curved line defined by the expression (1) with the temperature T of 150° C. or higher and 230° C. or lower and the current density J of 120 [A/cm²] or more and 400 [A/cm²] or less is the setting range for achieving a testing time (the time during which a forward current is caused to flow through the semiconductor device) of 10 minutes or less.

The upper limit value of the current density is determined based on the temperature at which the saturation of the forward current appears. The lower limit value of the current density is the current value for achieving the time t of 10 minutes or less at the maximum settable temperature of 230° C.

The upper limit of temperature is decided based on the fact that the solder wettability deteriorates at a temperature of 230° C. or higher. If the temperature T is not 150° C. or higher and 230° C. or lower and the current density J is not 120 [A/cm²] or more and 400 [A/cm²] or less, the effects of the present embodiment can be produced on the condition that t in Expression (1) is less than or equal to 10 minutes. That is, the effects of the present embodiment can be produced if the temperature T and the current density J in FIG. 10 fall within the range above the extension of the solid line obtained from the Expression (1). It has taken one hour or more to determine the forward voltage with the conventional technique. Meanwhile, the semiconductor device determination can be performed in 10 minutes or less if the semiconductor device is kept within the range of the current density and the temperature shown in FIG. 10. The chips are sorted out based on this determination, thus leading to reductions in the manufacturing cost.

<Examples of Determination Operation>

Figure 11:
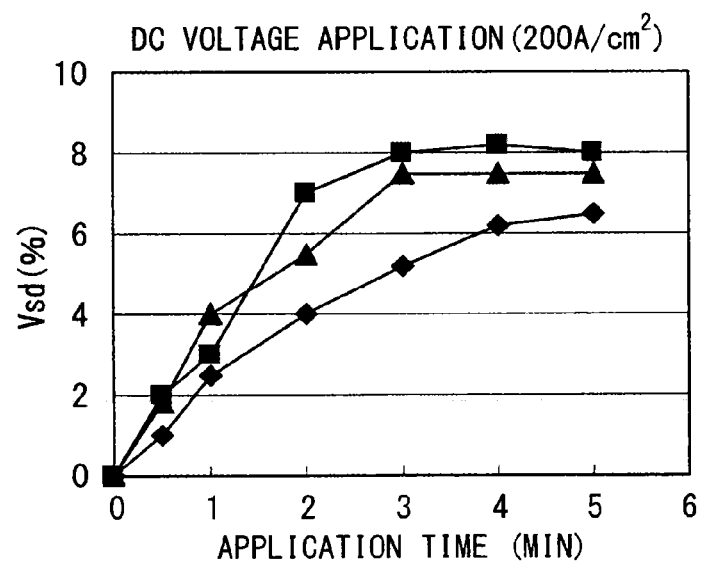
FIG. 11 illustrates the percentage change in forward voltage at a current density of 200 [A/cm$^2$].

FIGS. 11, 12, and 13 illustrates the time-varying percentage change Vsd on the condition that the temperature of the semiconductor device is set at 230° C. and the current density of the DC forward current is set at 200 [A/cm²], 250 [A/cm²], or 300 [A/cm²], which is considered to be desirable provided that the current density is lower than or equal to 400 [A/cm²] as described above. In each of the drawings, the vertical axis indicates the percentage change Vsd [%] of the forward voltage from the initial value and the horizontal axis indicates the application time [min]. The above-mentioned drawings each show a superimposed view of results of the tests performed on a plurality of semiconductor devices.

With reference to FIG. 11, it takes about 3 minutes before the percentage change Vsd reaches the saturation state at a current density of 200 [A/cm²]. With reference to FIG. 12, it takes about 2 minutes before the percentage change Vsd reaches the saturation state at a current density of 250 [A/cm²]. With reference to FIG. 13, it takes about 1.5 minutes before the percentage change Vsd reaches the saturation state at a current density of 300 [A/cm²]. With reference to FIGS. 11 and 12, the magnitude relation of the percentage change Vsd among the semiconductor devices varies until the forward voltage values of the individual semiconductor devices reach the saturation state. Such variations reflect the individual differences in the growth rate of stacking faults among the semiconductor devices. After the forward voltage values of the individual semiconductor devices have reached the saturation state, meanwhile, the magnitude relation of the percentage change Vsd among the semiconductor devices does not vary and is kept constant.

The time required to obtain the saturation state is shortened by increasing the current density. Consequently, it takes less time to perform tests on the semiconductor devices.

The following mainly describes the procedures, particularly with reference to FIG. 13 that illustrates the time-varying forward voltage in a case where a forward current having a current density of 300 [A/cm$^2$] is caused to flow through the body diode. The temperature of the semiconductor devices are set at 230° C.

The measurement of the temperature of the semiconductor device requires the preparatory measurements of a forward voltage Vf for obtaining a given forward current density (for example, 100 [A/cm$^2$]) and the preparatory measurements of the characteristics associated with the correlation between the forward voltage Vf and the temperature. The forward voltage Vf is the value of the voltage between the source and the drain when the semiconductor device is energized to obtain a given forward current density (for example, 100 [A/cm$^2$]). With the measured forward voltage Vf, the temperature of the semiconductor device can be measured on the basis of the above-mentioned correlation characteristics.

Before a current is actually caused to flow, the forward voltage Vf is measured and the water temperature is adjusted at the setting temperature (230° C.).

Then, a forward current is caused to flow so as to obtain a given current density (300 [A/cm$^2$]). The pulse duration is preferably set at 5 [ms] during ON-time, 45 [ms] during OFF-time, and a duty of 10% to meet the conditions under which the self-heating is less likely to occur due to the current.

Then, the percentage change Vsd [%] is measured over the course of energization time.

The current of 300 [A/cm$^2$] is interrupted, and then, a forward current is caused to flow at the current density of, for example, 100 [A/cm$^2$]. At this time, the forward voltage Vf is measured, whereby the temperature of the semiconductor device is calculated and verified. This calculation is performed with reference to the characteristics associated with the correlation between the temperature of the semiconductor device and the forward voltage Vf. The temperature of the semiconductor device is controlled by adjusting the temperature of circulating water.

The above-mentioned step is repeated to cause a pulse current to flow at a current density of 300 [A/cm$^2$] for 20 minutes. With a duty of 1/10, the DC is applied for 2 minutes within this time period.

The energization is stopped when the saturation characteristic of the forward voltage Vf has appeared and the forward voltage Vf has reached saturation after a certain period of time, which depends on the current density and the setting temperature. Optionally, the energization is stopped at a predicted time of saturation. The percentage change Vsd at that point in time is measured to assess the stacking faults.

The greater increase in the percentage change Vsd from the initial state indicates the further degradation associated with stacking faults. Thus, the energization may be stopped when the percentage change Vsd has exceeded a given value based on the assumption that the degradation has occurred (NG). In this case, it is determined that the percentage change Vsd is sufficiently greater than the initial value although the percentage change Vsd has not reached saturation.

Thus, whether the semiconductor device has degraded due to stacking faults can be determined on the basis of the magnitude of the percentage change Vsd obtained from the results of the energization check (Step S7 in FIG. 1) after the chip test (Step S6 in FIG. 1). For example, the semiconductor device in which the forward voltage Vf has increased by less than 3%, or desirably by less than 1%, from the initial value is sorted out as a non-defective item. Thus, whether the characteristic degradation of the body diode has occurred in the energization check can be determined.

The stacking fault density is determined on the basis of the percentage change Vsd at the time of appearance of the saturation characteristic. Thus, the stacking fault density can be accurately determined in a short time without being affected by the individual variations in the growth rate of stacking faults among the semiconductor devices.

The energization check was performed on the semiconductor device having the percentage change Vsd of less than 1% relative to the initial value from among the semiconductor devices in which the percentage changes Vsd reached saturation in 1.5 minutes in a case where a forward current was caused to flow at a current density of 300 [A/cm$^2$] (at a setting temperature of 230° C.). As a result, no defection occurred in the energization check. Thus, the semiconductor device having the percentage change Vsd of less than 1% relative to the initial value can be defined as the determination criterion in sorting out non-defective semiconductor apparatuses.

Figures 14, 15:
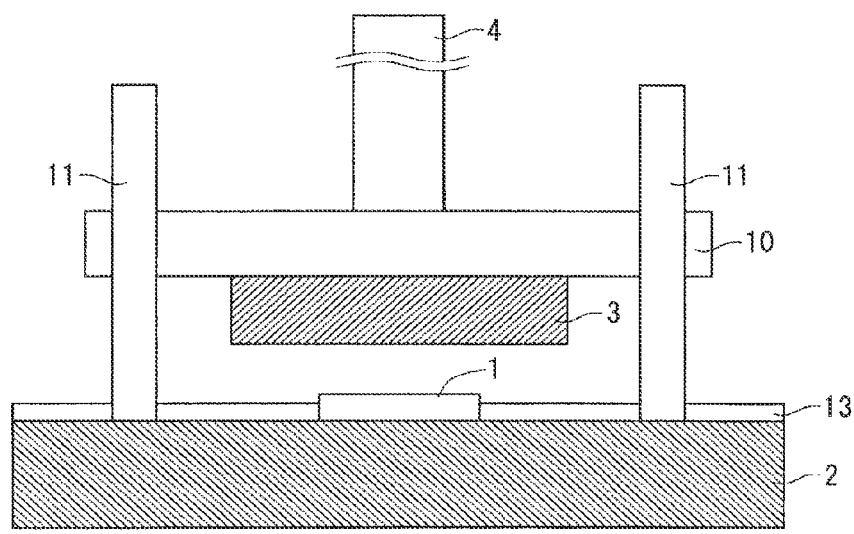
FIG. 14 illustrates the relation between the yield percentage of evaluated chips and the efficiency percentage after an energization test.
FIG. 15 is a cross-sectional view of an energization test apparatus according to the embodiment.

FIG. 14 illustrates the relation between the yield percentage [%] of the semiconductor device having the percentage change Vsd of less than 1% relative to the initial value and the efficiency percentage [%] after the energization test.

As shown in FIG. 14, the individual semiconductor devices having the percentage change Vsd of less than 1% in the energization check have an efficiency percentage of 100%. Thus, at any yield percentage, the semiconductor device having the percentage change Vsd of, for example, less than 1% can be sorted out as a non-defective item because the characteristics of the body diode are not degraded in the energization check.

With reference to FIG. 14, the semiconductor device having the percentage change Vsd of less than 1% has been regarded as a non-defective item. Depending on the intended use of the semiconductor device, the reference value used to determine whether the semiconductor device is a non-defective item may be greater than 1% (for example, 3%) but not equal to 1%.

In the example described in the present embodiment, the temperature of the semiconductor device has been calculated based on the measurement of the forward voltage. Alternatively, the temperature of the semiconductor device may be measured by an infrared camera. Still alternatively, a radiation thermometer may be used to measure the temperature or a thermocouple may be attached to the semiconductor device in advance to measure the temperature.

<Energization Test Apparatus>

FIG. 15 is a cross-sectional view of an energization test apparatus according to the present embodiment. As shown in FIG. 15, the energization test apparatus includes a positioning plate 13 that positions a semiconductor device 1, a cooling plate 2 located on the back surface of the positioning plate 13, a plurality of shafts 11 located on the cooling plate 2 and extending in the direction of the normal to the cooling plate 2, a pressure-plate holding plate 10 located to bridge the plurality of shafts 11, a pressure plate 3 held by the pressure-plate holding plate 10 and facing the semiconductor device 1, and a pressure shaft 4 located on the side of the pressure-plate holding plate 10 opposite to the side having the pressure plate 3 held thereon.

The semiconductor device 1, which is the object of the test, includes electrodes provided at least on the front surface and the back surface. The semiconductor device 1 is, for example, a Schottky barrier diode (SBD) made of silicon carbide or a MOSFET.

The cooling pate 2 is in contact with the back surface electrode of the semiconductor device 1 and thus connects the back surface electrode of the semiconductor device 1 with the power source for energization. In addition, the cooling plate 2 provides cooling during energization.

The cooling plate 2 is also connected with the cathode or the anode of the power source for energization. The cooling plate 2 may be made of metal, such as stainless steel, copper, or aluminum, or any material that has a high thermal conductivity, such as carbon.

The cooling plate 2 may include a channel in which heat is exchanged through the passage of a medium such as cooling water provided by, for example, a chiller that circulates water or a heating medium while controlling the liquid temperature. Alternatively, for example, a structure having slits (the structure that efficiently exchanges heat with air) may be provided on the surface of the cooling plate 2 opposite to the surface that is in contact with the back surface of the semiconductor device 1 such that heat is exchanged mainly by a flow of air generated by, for example, a fan.

The structure of the cooling plate 2 needs to be selected depending on the amount of heat generated due to energization. In general, the air cooling is desirably selected if the electric energy is smaller than or equal to 100 [W]. The water cooling is desirably selected if the electric energy is greater than 100 [W].

Figure 16:
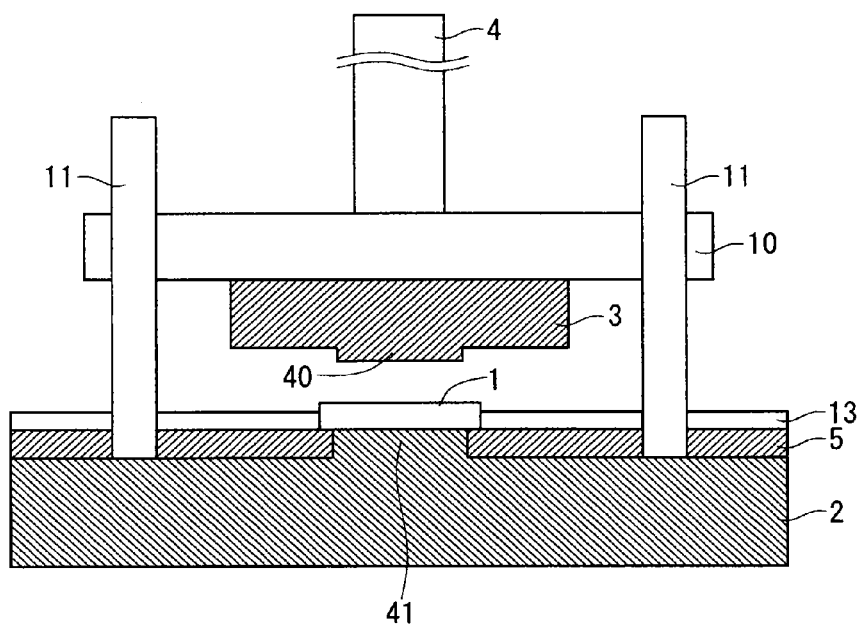
FIG. 16 is a cross-sectional view of the energization test apparatus according to the embodiment.

Assume that the surface of the cooling plate 2 that is in contact with the back surface of the semiconductor device 1 is polished to ensure a uniform contact with the object of the test and thus has a surface roughness Ra that is less than or equal to 5 [μm], or desirably less than or equal to 2 [μm]. To ensure a uniform in-plane temperature distribution of the semiconductor device 1 during energization, the cooling plate 2 desirably includes, as shown in FIG. 16, a cooling plate terrace 41 (a projecting portion) on the surface that is in contact with the back surface of the semiconductor device 1 and the cooling plate terrace 41 is desirably surrounded by a second metal 5.

Figure 17:
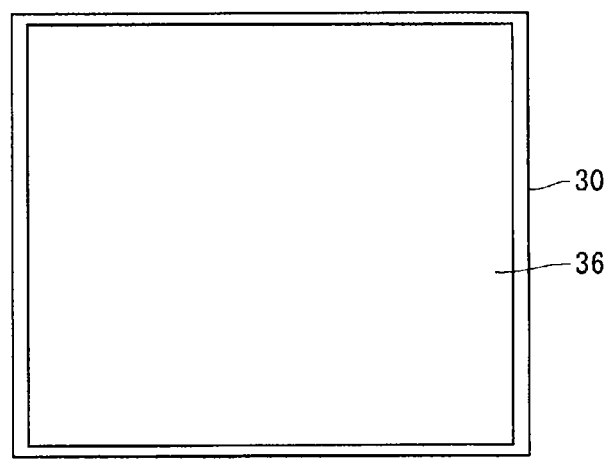
FIG. 17 is a top view of a semiconductor device.

For the semiconductor device having the structure shown in, for example, FIG. 17, the cooling plate terrace 41 desirably has a size that is equal to or greater than a region 36 of the semiconductor device in which a current flows and is smaller than or equal to 120% of a substrate 30 of the semiconductor device.

Figure 18:
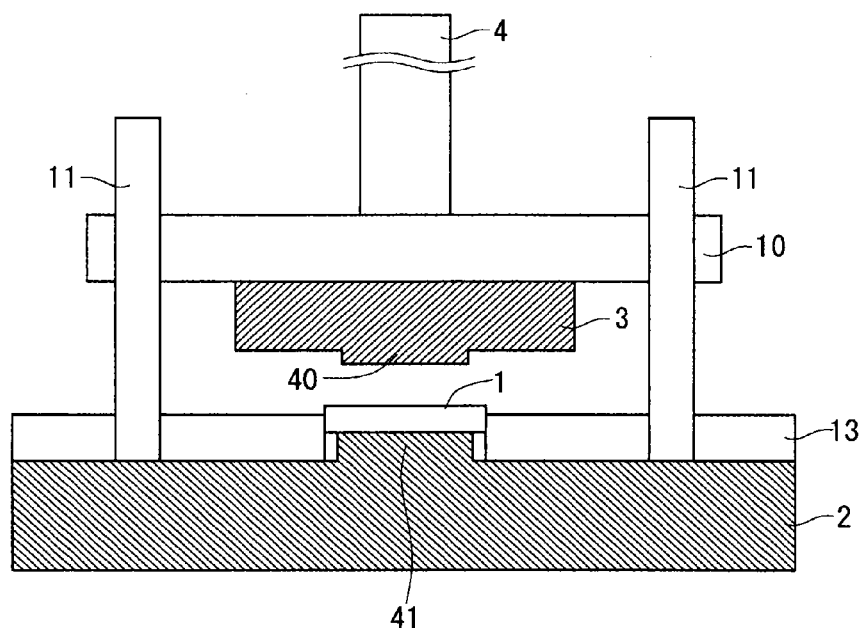
FIG. 18 is a cross-sectional view of the energization test apparatus according to the embodiment.

Alternatively, as shown in FIG. 18, the periphery of the cooling plate terrace 41 may not be covered by the second metal 5.

Figure 19:
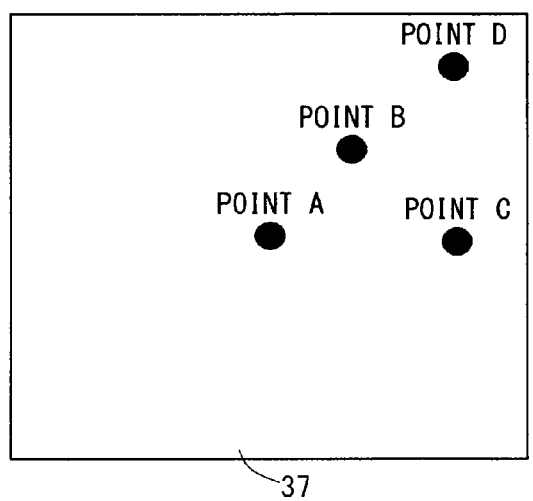
FIG. 19 is a view of a back surface electrode of the semiconductor device.
Figure 20:
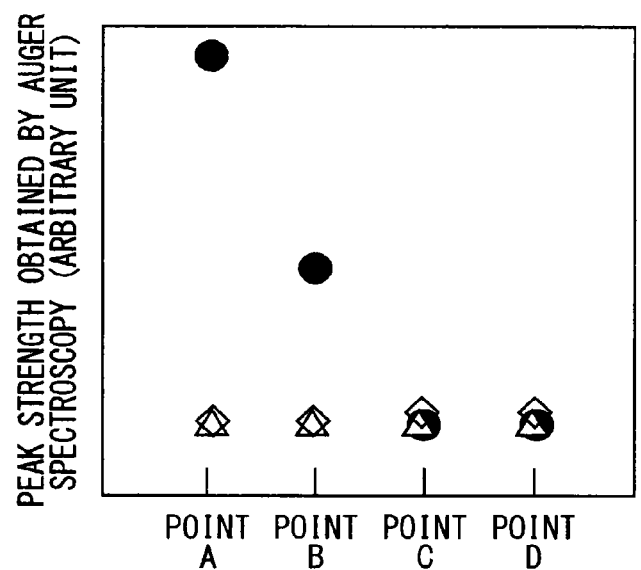
FIG. 20 illustrates results of comparisons of Ni peak strength obtained by Auger spectroscopy.

FIG. 19 and FIG. 20 illustrate the results (see FIG. 20) of comparison of Ni peak strength obtained by Auger spectroscopy at points A, B, C, and D (see FIG. 19) in a back surface electrode 37 of the semiconductor device 1 after energization. With reference to FIG. 20, the vertical axis indicates the Ni peak strength (arbitrary unit) obtained by Auger spectroscopy and the horizontal axis indicates the individual points at which the comparisons are made.

The back surface electrode 37 of the semiconductor device 1 has a structure in which gold (Au) is laminated on nickel (Ni) under normal conditions, and thus, no Ni peak is obtained by Auger spectroscopy. However, when the back surface electrode 37 is heated, Ni atoms diffuse across Au, and then, the Ni atoms appear in the surface of Au. Thus, the in-plane temperature distribution of the semiconductor device 1 during energization can be checked for uniformity through the comparisons of the Ni peak strength obtained by Auger spectroscopy.

The circles in FIG. 20 indicate the results obtained in a case where the cooling plate 2 made of copper does not include the cooling plate terrace 41. The triangles indicate the results obtained in a case where the cooling plate 2 made of coper includes the cooling plate terrace 41 that has a height of 1 [mm] and has the same size as the substrate 30 and the cooling plate 2 is surrounded by stainless steel being the second metal 5. The squares indicate the results obtained in a case where the cooling plate 2 made of copper includes the cooling plate terrace 41 that has a height of 1 [mm] and has the same size as the substrate 30 and the second metal 5 is not provided. It is only required that the height of the cooling plate terrace 41, which is set to be 1 [mm], is greater than or equal to 0.5 mm.

As evident from FIG. 20, in a case where the cooling plate terrace 41 is not provided, the temperature of the midpoint of the back surface electrode 37 of the semiconductor device 1 increases, causing the extensive diffusion of Ni. In a case where the cooling plate terrace 41 is provided, meanwhile, the diffusion of Ni is regulated across the entire surface and thus the in-plane temperature distribution is uniform.

To regulate the oxidation of the cooling plate 2, the surface of the cooling plate 2 is preferably coated with a precious metal, particularly gold or platinum. However, if the surface of the back surface electrode 37 of the semiconductor device 1 is made of Au, the cooling plate 2 would adhere to the back surface electrode 37 through the Au coating on the surface of the cooling plate 2 due to heat generated during energization. In this case, the surface of the cooling plate 2 cannot be coated with Au.

The pressure plate 3 is connected to the pole of the power source for energization opposite to the pole connected with the cooling plate 2. The pressure plate 3 comes in contact with the front surface electrode of the semiconductor device 1 in order to energize the semiconductor device 1. The pressure plate 3 is desirably made of, for example, metal, such as stainless steel, aluminum, or copper, or other materials such as carbon. If the pressure plate 3 is made of copper, the surface of the pressure plate 3 is desirably coated with a precious metal, particularly gold or platinum, in order to regulate the oxidation caused by heat generated during energization. However, if the surface of the front surface electrode of the semiconductor device 1 is made of Au, the pressure plate 3 would adhere to the front surface electrode through the Au coating on the pressure plate 3 due to heat generated during energization. In this case, the surface of the pressure plate 3 cannot be coated with Au.

Figure 21:
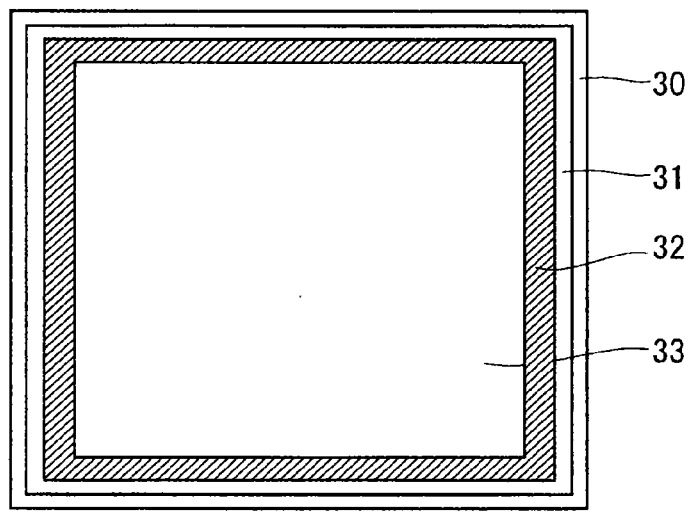
FIG. 21 is a view of a front surface electrode of the semiconductor device.
Figure 22:
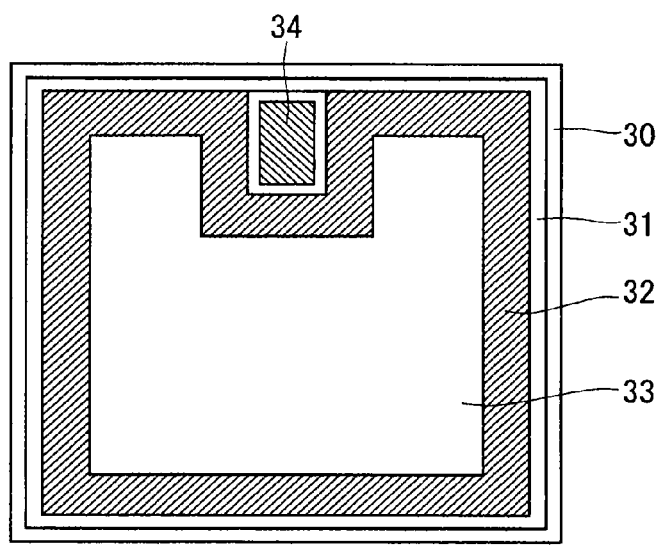
FIG. 22 is a view of the front surface electrode of the semiconductor device.
Figure 23:
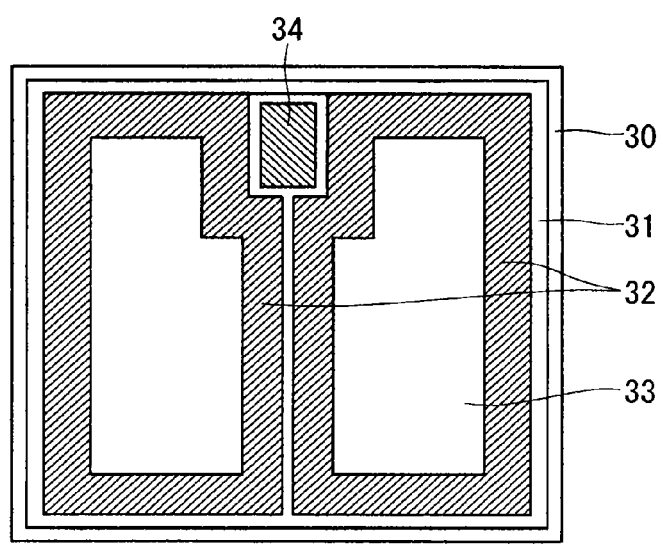
FIG. 23 is a view of the front surface electrode of the semiconductor device.

As shown in FIGS. 21, 22, and 23, if polyimide 31 is located in the periphery of a front surface electrode 32 of the semiconductor device 1, a pressure plate terrace 40 (projecting portion) such as the one shown in FIGS. 16 and 18 may be provided to protect the polyimide 31 against deformation or damage caused by the pressure plate 3. As shown in FIGS. 21, 22, and 23, the pressure plate terrace 40 has a pressure-plate-terrace upper surface shape 33 that varies depending on the surface structure of the semiconductor device 1 (and also varies depending on the position of a gate electrode 34), and thus is formed so as to come in contact only with the area occupied by the front surface electrode 32. It is only required that the pressure plate terrace 40 has a height of 0.5 [mm] or more. The surface roughness Ra of the pressure plate terrace 40 is set to be less than or equal to 5 [μm], or is desirably set to be less than or equal to 2 [μm].

The positioning plate 13 is provided to locate the semiconductor device 1 in an appropriate position on the cooling plate 2. Thus, the positioning plate 13 positions the semiconductor device 1 on cooling plate 2.

The pressure-plate holding plate 10 is entirely or partially made of an insulating material such as a polyetheretherketone (PEEK (registered trademark)) material, a polyimide material, or a Tefron (registered trademark) material in order to electrically insulate the cooling plate 2 and the pressure plate 3.

The pressure-plate holding plate 10 is adjusted so as to easily move upward and downward (in the direction toward the cooling plate 2 and in the direction away from the cooling plate 2), and is thus capable of pushing the pressure plate 3 against the semiconductor device 1 on the cooling plate 2 with a constant pressure through the pressure shaft 4.

The pressure shaft 4 is fixed such that a constant pressure can be applied with, for example, a hydraulic jack. The pressure to be applied is not limited within a particular range. For the SiC device, a load of 30 [kg-wt] or more per square centimeter [$cm^2$] is desirably imposed to bring the cooling plate 2 and the pressure plate 3 into contact with the semiconductor device 1. To prevent the possible breakdown of the semiconductor device 1, it is desirable that no load exceeding 50 [kg-wt] per square centimeter [$cm^2$] is imposed.

The shafts 11 define the relative positions of the positioning plate 13, the cooling plate 2, and the pressure-plate holing plate 10. The number of the shafts 11 is at least four. Besides the two shafts shown in each of FIGS. 15, 16, and 18, two more shafts are disposed in the direction vertical to the drawing plane.

Optionally, the relative positions of the positioning plate 13, the cooling plate 2, and the pressure-plate holding plate 10 are defined by a structure other than the shafts 11. In this case, for example, the pressure shaft 4 and the pressure-plate holding plate 10 are connected such that the position of the pressure portion (not shown) having the pressure shaft 4 connected thereto is fixed relative to the positioning plate 13 and the cooling plate 2.

The water cooling control means has been described above as a means for dissipating heat to control the temperature of the semiconductor device 1. Alternatively, the air cooling control may be implemented. To raise the temperature, a heater may be disposed on the pressure plate 3 to set the desired temperature.

The temperature control may be implemented through the manual measurement of temperature and the manual adjustment of water temperature. Alternatively, a control apparatus may be attached to the temperature measuring output to automatically control the temperature.

To provide a constant current density, the current measurement apparatus measures the current flowing through the semiconductor device 1 and then the measurement value is reflected in the control of current value. Alternatively, this may be achieved by controlling the voltage applied onto the semiconductor device 1.

In the above description, the present embodiment has been applied to the chip test. Similarly, the present embodiment is applicable to the test on semiconductor substrates prior to the dicing.

In the above description, the present embodiment has been applied to the test on elements during the production of semiconductor apparatuses. The present embodiment may be applicable to the test on modules after the production of semiconductor apparatuses and to the test on discrete elements.

In the present embodiment described above, a current has been applied in pulses. Alternatively, a DC may be applied. In a case where a current is applied in pulses, the application time is increased by the reciprocal of the duty of a pulse.

The Vsd can be measured by applying the pulse forward voltage at a current density of 300 [$A/cm^2$]. This requires a longer period of current application than that of the DC application. In principle, it is necessary to set the current application time such that the total amount of the pulse ON-time is equivalent to the DC application time.

<Effects>

According to the present embodiment, the method for manufacturing silicon carbide semiconductor apparatus includes a setting step of setting the temperature of a bipolar semiconductor element made of silicon carbide at 150° C. or higher and 230° C. or lower, an energizing step of causing a forward current having a current density of 120 [$A/cm^2$] or more and 400 [$A/cm^2$] or less to continuously flow through the bipolar semiconductor element, a calculating step of calculating, in a case where the forward resistance of the bipolar semiconductor element through which the forward current flows reaches a saturation state, the degree of change in the forward resistance, and a determining step of determining whether the calculated degree of change is smaller than the threshold value.

In this configuration, the bipolar semiconductor element can be tested for the presence or absence of stacking faults in a short time on the basis of the degree of change in the forward resistance that has reached the saturation state due to the continuous flow of the forward current having a current density of 120 [$A/cm^2$] or more and 400 [$A/cm^2$] or less.

On the basis of the degree of change in the saturation state, which is unaffected by the individual variations in the growth rate of stacking faults, the degree of change can be accurately determined relative to the threshold value. In addition, the forward voltage is saturated, and thus, the energization check can be performed without causing the breakdown of elements.

In the present embodiment, the energization test apparatus includes the cooling plate 2 that is located so as to come in contact with the back surface electrode 37 of the bipolar semiconductor element and cools the bipolar semiconductor element and the pressure plate 3 that is located so as to come in contact with the front surface electrode 32 of the bipolar semiconductor element and applies a pressure onto the bipolar semiconductor element.

While the material quality, the materials, the implementation conditions, and the like of the individual constituent components have been described in the above embodiment, the foregoing description is in all aspects illustrative and thus the present invention is not limited thereto. It is therefore understood that numerous unillustrated modifications (in which any of the constituent components can be varied or omitted, and each embodiment can be arbitrarily combined) can be devised within the scope of the invention.

EXPLANATION OF REFERENCE NUMERALS 1 semiconductor device, 2 cooling plate, 3 pressure plate, 4 pressure shaft, 5 second metal, 10 pressure-plate holding plate, 11 shaft, 13 positioning plate, 30 substrate, 31 polyimide, 32 front surface electrode, 33 pressure-plate-terrace upper surface shape, 34 gate electrode, 36 region, 37 back surface electrode, 40 pressure plate terrace, 41 cooling plate terrace.

The invention claimed is:

1. A method for manufacturing silicon carbide semiconductor apparatus, said method comprising:
a setting step of setting a temperature of a bipolar semiconductor element made of silicon carbide at 150° C. or higher and 230° C. or lower;
an energizing step of causing a forward current having a current density of 120 [$A/cm^2$] or more and 400

[A/cm$^2$] or less to continuously flow through said bipolar semiconductor element;

a calculating step of calculating, in a case where a forward resistance of said bipolar semiconductor element through which said forward current flows reaches a saturation state, a degree of change in said forward resistance; and a determining step of determining whether said calculated degree of change is smaller than a threshold value, wherein in said calculating step of calculating a degree of change in said forward resistance, in a case where said forward resistance of said bipolar semiconductor element through which said forward current flows has increased to reach the saturation state, said degree of change in said forward resistance is calculated.

2. A method for manufacturing silicon carbide semiconductor apparatus, said method comprising:

a setting step of setting a temperature of a bipolar semiconductor element made of silicon carbide at 150° C. or higher and 230° C. or lower;

an energizing step of causing a forward current having a current density of 120 [A/cm$^2$] or more and 400 [A/cm$^2$] or less to continuously flow through said bipolar semiconductor element;

a calculating step of calculating, in a case where a forward resistance of said bipolar semiconductor element through which said forward current flows reaches a saturation state, a degree of change in said forward resistance; and a determining step of determining whether said calculated degree of change is smaller than a threshold value, wherein a time t [min] during which said forward current is caused to flow through said bipolar semiconductor element is expressed by $$t \geq \mathrm{EXP}\left(0.31\left(\frac{1}{273+T} - \frac{1}{503}\right)\frac{1}{8.62\times 10^{-5}}\right) \times \frac{1200}{J} \quad \text{[Math 1]}$$

where

J [A/cm$^2$] represents the current density of said forward current caused to flow through said bipolar semiconductor element in said energizing step, and T [° C.] represents a temperature set for said bipolar semiconductor element in said setting step.

3. The method for manufacturing silicon carbide semiconductor apparatus according to claim 1, further comprising a molding step of sealing said bipolar semiconductor element with resin after said determining step.

4. The method for manufacturing silicon carbide semiconductor apparatus according to claim 1, wherein said energizing step causes a forward current having a current density of 200 [A/cm$^2$] or more and 300 [A/cm$^2$] or less to continuously flow through said bipolar semiconductor element.

5. The method for manufacturing silicon carbide semiconductor apparatus according to claim 1, wherein said bipolar semiconductor element comprises a body diode for a MOSFET.

6. The method for manufacturing silicon carbide semiconductor apparatus according to claim 1, wherein said threshold value is 3%.

7. The method for manufacturing silicon carbide semiconductor apparatus according to claim 1, wherein said threshold value is 1%.

8. An energization test apparatus that causes said forward current to flow between a front surface electrode and a back surface electrode located on a front surface and a back surface of said bipolar semiconductor element in the method for manufacturing silicon carbide semiconductor apparatus according to claim 1, said apparatus comprising:

a cooling plate located so as to come in contact with said back surface electrode of said bipolar semiconductor element, said cooling plate cooling said bipolar semiconductor element; and a pressure plate located so as to come in contact with said front surface electrode of said bipolar semiconductor element, said pressure plate applying a pressure onto said bipolar semiconductor element.

9. The energization test apparatus according to claim 8, wherein at least one of said pressure plate and said cooling plate includes a projecting portion in a part that comes in contact with said bipolar semiconductor element, and said projecting portion extends for 0.5 [mm] or more from another part that does not come in contact with said bipolar semiconductor element.

10. The energization test apparatus according to claim 9, wherein a surface of said projecting portion of at least one of said pressure plate and said cooling plate has a surface roughness Ra of 2 [μm] or less, said surface coming in contact with said bipolar semiconductor element.

11. The energization test apparatus according to claim 8, wherein said pressure plate and said cooling plate are made of:

stainless steel;

aluminum; or copper, where surfaces of said pressure plate and said cooling plate being coated with gold or platinum.

12. The energization test apparatus according to claim 8, wherein said pressure plate applies a pressure of 30 [kg-wt] or more and 50 [kg-wt] or less per square centimeter [cm$^2$] onto said bipolar semiconductor element.

* * * * *